(12) United States Patent
Jia et al.

(10) Patent No.: US 12,315,992 B2
(45) Date of Patent: May 27, 2025

(54) METAL MESH, THIN FILM SENSOR AND MASK

(71) Applicant: BOE TECHNOLOGY GROUP CO., LTD., Beijing (CN)

(72) Inventors: Mengwen Jia, Beijing (CN); Hai Yu, Beijing (CN); Yafei Zhang, Beijing (CN); Yali Wang, Beijing (CN); Dongdong Zhang, Beijing (CN); Feng Qu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/789,772

(22) PCT Filed: Jun. 25, 2021

(86) PCT No.: PCT/CN2021/102533
§ 371 (c)(1),
(2) Date: Jun. 28, 2022

(87) PCT Pub. No.: WO2022/267053
PCT Pub. Date: Dec. 29, 2022

(65) Prior Publication Data
US 2024/0195054 A1    Jun. 13, 2024

(51) Int. Cl.
*H01Q 1/38* (2006.01)
*G06F 3/044* (2006.01)

(52) U.S. Cl.
CPC .............. *H01Q 1/38* (2013.01); *G06F 3/044* (2013.01); *G06F 3/0448* (2019.05); *G06F 2203/04112* (2013.01)

(58) Field of Classification Search
None
See application file for complete search history.

(56) References Cited

U.S. PATENT DOCUMENTS 9,154,127 B2 * 10/2015 Guard ................... G06F 3/0443
10,705,657 B2    7/2020 Lee et al.
(Continued)

FOREIGN PATENT DOCUMENTS

CN    202677331 U    1/2013
CN    103377754 A    10/2013
(Continued)

*Primary Examiner* — Stephen T. Reed
(74) *Attorney, Agent, or Firm* — HOUTTEMAN LAW LLC

(57) ABSTRACT

A metal mesh includes: first metal lines (11) and second metal lines (12) extending in crossed directions. The first metal lines (11) are arranged side by side in a first direction and extend in a second direction; the second metal lines (12) are arranged side by side in the first direction and extend in a third direction. Each first metal line (11) includes first sub-line segments sequentially connected together in the second direction, and each second metal line (12) includes second sub-line segments sequentially connected together in the third direction. Each first sub-line segment has a midpoint superposing with a midpoint of one of the second sub-line segments, the first and second sub-line segments having superposed midpoints form a crossed structure (10), and define two opposite first angles ($\theta 1$) and two opposite second angles ($\theta 2$). Each first angle ($\theta 1$) is not greater than each second angle ($\theta 1$).

20 Claims, 15 Drawing Sheets

(56) References Cited

U.S. PATENT DOCUMENTS

| | | | |
|---|---|---|---|
| 10,705,665 | B2 | 7/2020 | Xie et al. |
| 10,890,997 | B2 | 1/2021 | Kim et al. |
| 2014/0216803 | A1 | 8/2014 | Cheng et al. |
| 2015/0041301 | A1 | 2/2015 | Lee et al. |
| 2018/0024689 | A1 | 1/2018 | Yoshiki |
| 2018/0113345 | A1 | 4/2018 | Song et al. |
| 2019/0155424 | A1 | 5/2019 | Nukui et al. |
| 2021/0365137 | A1* | 11/2021 | Xie .................. G06F 3/047 |
| 2022/0310711 | A1* | 9/2022 | Liu .................. H10K 59/353 |
| 2025/0017069 | A1* | 1/2025 | Chen .................. H10K 59/353 |

FOREIGN PATENT DOCUMENTS

| | | |
|---|---|---|
| CN | 104281320 A | 1/2015 |
| CN | 106502454 A | 3/2017 |
| CN | 106940605 A | 7/2017 |
| CN | 107407999 A | 11/2017 |
| CN | 107515697 A | 12/2017 |
| CN | 108415615 A | 8/2018 |
| CN | 109564488 A | 4/2019 |
| CN | 209086887 U | 7/2019 |
| CN | 209086888 U | 7/2019 |
| CN | 104679322 B | 11/2019 |
| CN | 110442265 A | 11/2019 |
| CN | 111081731 A | 4/2020 |
| CN | 111413846 A | 7/2020 |
| CN | 112698750 A | 4/2021 |
| CN | 112882338 A | 6/2021 |
| TW | I714446 B | 12/2020 |

* cited by examiner

METAL MESH, THIN FILM SENSOR AND MASK

CROSS REFERENCE TO RELATED APPLICATIONS

This is a National Phase Application filed under 35 U.S.C. 371 as a national stage of PCT/CN2021/102533 filed on Jun. 25, 2021, the content of which is incorporated herein by reference in its entirety.

TECHNICAL FIELD

The present disclosure relates to the field of sensor technology, and specifically relates to a metal mesh, a thin film sensor, and a mask.

BACKGROUND

The current micro-nano processing technology commonly used in the glass-based semiconductor industry has a line width of 5 µm or less. However, some thin film display and sensing devices has put forward higher requirements on the line width of micro-nano processing, such as transparent antennas or radio frequency devices.

SUMMARY

Some embodiments of the present disclosure provide a metal mesh, a thin film sensor, and a mask.

In a first aspect, an embodiment of the present disclosure provides a metal mesh, including: a plurality of first metal lines and a plurality of second metal lines extending in crossed directions; wherein the first metal lines are arranged side by side in a first direction and extend in a second direction; the second metal lines are arranged side by side in the first direction and extend in a third direction; and wherein each first metal line includes a plurality of first sub-line segments sequentially connected together in the second direction, and each second metal line includes a plurality of second sub-line segments sequentially connected together in the third direction. Each first sub-line segment has a midpoint superposing with a midpoint of one of the second sub-line segments, the first sub-line segment and the second sub-line segment having the superposed midpoints form a crossed structure, and define two opposite first angles and two opposite second angles; each first angle is not greater than each second angle;

the crossed structure includes a first virtual quadrangle and a second virtual quadrangle; the first sub-line segment is arranged in the first virtual quadrangle, and the first virtual quadrangle has a width being a maximum width of the first sub-line segment and a length being a length of the first sub-line segment; the second sub-line segment is arranged in the second virtual quadrangle, and the second virtual quadrangle has a width being a maximum width of the second sub-line segment and a length being a maximum length of the second sub-line segment; and For any crossed structure, two sides defining each first angle are a first side and a second side, respectively, and a length of a connection line between a point S1 on the first side and a point S2 on the second side is a maximum distance L1 between the first side and the second side; the connection line between the point S1 and the point S2 intersects with a side of the first virtual quadrangle at a point S3, intersects with a side of the second virtual quadrangle at a point S4, and a connection line between the point S3 and the point S4 has a length L2; wherein L1 is greater than L2.

The first sub-line segment in the crossed structure includes two first branches, and a first connection part arranged between and connecting the two first branches; the second sub-line segment includes two second branches together, and a second connection part arranged between and connecting the two second branches together; the first connection part and the second connection part are arranged in a crossed manner; the first branches and the second branches each have a maximum width $a_1$, the first side and the second side each have a length $b_1$, and the first connection part and the second connection part each have a width $c_1$; where $3a_1 < b_1 < 5a_1$; and $0.6a_1 < c_1 < 0.8a_1$.

Each first branch is connected to the first connection part to form a dihedral angle not less than 90°.

The first sub-line segment forms an axisymmetric pattern with a straight line running through a midpoint of the maximum width of the first sub-line segment in the second direction as an axis of symmetry; and the second sub-line segment forms an axisymmetric pattern with a straight line running through a midpoint of the maximum width of the second sub-line segment in the third direction as an axis of symmetry.

Each first angle includes a flat chamfer or a rounded chamfer; and in the crossed structure, a distance L3 is provided between an intersection point of extension lines of the first side and the second side and a vertex of the first angle, and a distance L4 is provided between the intersection point of the extension lines of the first side and the second side and a center of an intersection region of the first sub-line segment and the second sub-line segment; where L3:L4=1:10 to 1:2.

For any crossed structure, two sides defining each second angle are a third side and a fourth side, respectively, and a length of a connection line between a point S5 on the third side and a point S6 on the fourth side is a maximum distance L5 between the third side and the fourth side; the connection line between the point S5 and the point S6 intersects with a side of the first virtual quadrangle at a point S7, intersects with a side of the second virtual quadrangle at a point S8, and a connection line between the point S7 and the point S8 has a length L6; where L5 is greater than L6.

The connection line between the point S1 and the point S2 defines an area A with the first sub-line segment and the second sub-line segment, and the connection line between the point S5 and the point S6 defines an area B with the first sub-line segment and the second sub-line segment; and the first sub-line segment and the second sub-line segment have an intersection area C; where $(A+B):C \leq 1:2$.

Each second angle includes a rounded chamfer or a flat chamfer.

A connection line between vertices of the two second angles forms an angle with the first direction.

The first sub-line segment in the crossed structure includes two first branches, and the second sub-line segment includes two second branches; the crossed structure further includes a first annular connection part connecting between the two first branches and the two second branches; and in the crossed structure, the two first branches and the two second branches are connected to the first annular connection part at different nodes from each other.

A first bridge part is connected between any adjacent two second angles with opposite openings.

In a second aspect, an embodiment of the present disclosure provides a thin film sensor, including the metal mesh as described above.

In a third aspect, an embodiment of the present disclosure provides a mask, including: a light-shielding part and a light-transmitting part; wherein the light-shielding part includes a plurality of first light-shielding strips and a plurality of second light-shielding strips arranged in a crossed manner; the plurality of first light-shielding strips extend in a second direction and arranged side by side in a first direction; and the plurality of second light-shielding strips extend in a third direction and arranged side by side in the first direction;

a maximum width of each first light-shielding strip is a first width, and a maximum width of each second light-shielding strip is a second width;

each first light-shielding strip includes a plurality of first sub-shielding strips arranged in the second direction, each of which extends in the second direction and has a width equal to the first width; each second light-shielding strip includes a plurality of second sub-shielding strips arranged in the third direction, each of which extends in the third direction and has a width equal to the second width;

wherein a distance is provided between any adjacent two of the first sub-shielding strips on any one of the first light-shielding strips; and any adjacent two of the first sub-shielding strips form a first sub-shielding part having a first end and a second end disposed oppositely; a distance is provided between any adjacent two of the second sub-shielding strips on any one of the second light-shielding strips; and any adjacent two of the second sub-shielding strips form a second sub-shielding part having a third end and a fourth end disposed oppositely; and wherein the light-shielding part further includes at least one first light-shielding unit each including the first sub-shielding part and the second sub-shielding part arranged in a crossed manner; the first end and the second end are centrosymmetric relative to a first symmetry point; and in the first light-shielding unit, the two second sub-shielding strips include the third end and the fourth end disposed oppositely, and the third end and the fourth end are centrosymmetric relative to a second symmetry point.

The first symmetry point and the second symmetry point in each first light-shielding unit coincide with each other.

The mask further includes a third connection part connected between adjacent two first sub-shielding strips in the second direction, and a fourth connection part connected between adjacent two second sub-shielding strips in the third direction; the third connection part and the fourth connection part in each first light-shielding unit are arranged in a crossed manner;

each first sub-shielding strip has a width a2, and the third connection part has a length b2 and a width c2; where $1.5a2 < b2 < 2.5a2$; and $0.6a2 < c2 < 0.8a2$; and each second sub-shielding strip has a width d2, and the fourth connection part has a length e2 and a width f2; where $1.5d2 < e2 < 2.5d2$; and $0.6d2 < f2 < 0.8d2$.

The width a2 of the first sub-shielding strip is equal to the width d2 of the second sub-shielding strip; the length b2 of the third connection part is equal to the length e2 of the fourth connection part; and the width c2 of the third connection part is equal to the width f2 of the fourth connection part.

Each first sub-shielding strip is connected to the third connection part to form a dihedral angle not less than 90°; and each second sub-shielding strip is connected to the fourth connection part to form a dihedral angle not less than 90°.

Each first light-shielding unit is further provided with a second annular connection part; and the second annular connection part is connected between the two first sub-shielding strips and the two second sub-shielding strips in the first light-shielding unit, and the two first sub-shielding strips and the two second sub-shielding strips are connected to the second annular connection part at different intersection points from each other.

In each first light-shielding unit, the second annular connection part connects the two first sub-shielding strips and the two second sub-shielding strips in the first light-shielding unit together, and defines two opposite third angles and two opposite fourth angles, each third angle is not greater than each fourth angle, and a second bridge part is connected between two opposite fourth angles.

DETAIL DESCRIPTION OF EMBODIMENTS

To improve understanding of technical solutions of the present disclosure for one of ordinary skill in the art, the present disclosure will be described in detail with reference to accompanying drawings and specific implementations.

Unless otherwise defined, technical or scientific terms used in the present disclosure are intended to have general meanings as understood by one of ordinary skill in the art. The words "first", "second" and similar terms used in the present disclosure do not denote any order, quantity, or importance, but are used merely for distinguishing different components from each other. Also, the use of the term "a", "an", "the" or a similar referent does not denote a limitation of quantity, but rather denotes the presence of at least one element. The word "comprising", "including" or the like means that the element or item preceding the word contains elements or items that appear after the word or equivalents thereof, but does not exclude other elements or items. The term "connected", "coupled", or the like is not restricted to physical or mechanical connections, but may include electrical connections, whether direct or indirect. The word "upper", "lower", "left", "right", or the like is merely used to indicate a relative positional relationship, and when an absolute position of the described object is changed, the relative positional relationship may also be changed accordingly.

Figure 1:
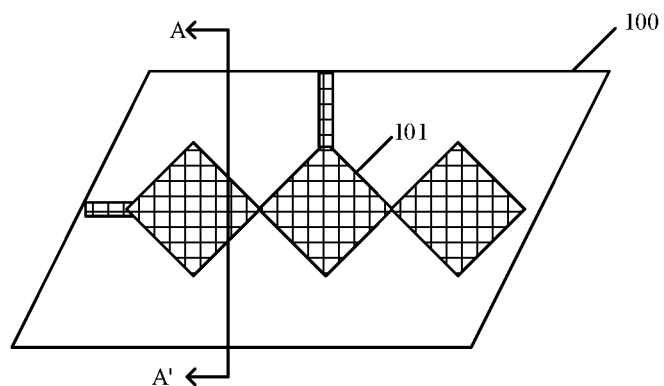
FIG. 1 is a schematic structural diagram of an exemplary thin film sensor.
Figure 2:
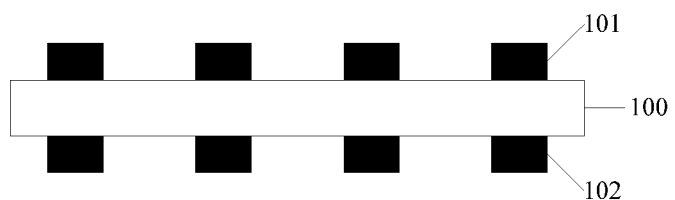
FIG. 2 is a schematic diagram of a sectional structure of the thin film sensor shown in FIG. 1 along a direction A-A'.

FIG. 1 is a schematic structural diagram of an exemplary thin film sensor. FIG. 2 is a schematic diagram of a sectional structure of the thin film sensor shown in FIG. 1 along a direction A-A'. As shown in FIGS. 1 and 2, the thin film sensor includes: a base substrate 100 having a first surface and a second surface, i.e., an upper surface and a lower surface, disposed oppositely (i.e., disposed opposite to each other); and a first conductive layer 101 and a second conductive layer 102 on the first surface and the second surface of the base substrate 100, respectively. Taking the thin film sensor being a transparent antenna as an example, the first conductive layer 101 may be a radiation layer, and the second conductive layer 102 may be a ground layer. The radiation layer may be used as a receiving unit of a structure of the antenna, or may be used as a transmitting unit of the structure of the antenna.

To ensure good light transmittance of the first conductive layer 101 and the second conductive layer 102, the first conductive layer 101 and the second conductive layer 102 need to be patterned. For example, the first conductive layer 101 may be formed by mesh lines made of a metal material, and the second conductive layer 102 may also be formed by mesh lines made of a metal material. It will be appreciated that each of the first conductive layer 101 and the second conductive layer 102 may be formed by structures of other patterns, such as block electrodes of diamond, triangle, or other patterns, which are not enumerated here. As can be seen from FIG. 1, not the entire two surfaces of the base substrate 100 are provided with the first conductive layer 101 and the second conductive layer 102, i.e., the mesh lines, respectively. Any mesh line may be formed by electrically connected metal grids. Due to the transmittance requirement of the thin film sensor, the metal mesh typically has a line width of 5 μm or less. The metal mesh with the line width of 5 μm or less may be manufactured by a metal film photoetching method. For example, a metal film is formed on the base substrate 100 through a sputtering process, a photoresist is coated on the metal film, and exposure, development, etching, and peeling off processes are performed to obtain a fine metal mesh. However, the inventors have found that when the line width of the metal mesh is equal to 5 μm or less, a small angle (acute angle) is formed at an intersection of the metal mesh, which makes the chemical solution used in the development and etching hard to enter the acute angle position of the metal mesh, leading to a relatively large intersection area at the intersection, thereby reducing an optical transparency of the thin film sensor.

It should be further noted here that the metal mesh is not limited to be applied in an antenna structure, but can also be applied in a touch panel as a touch electrode. Apparently, the metal mesh can also be used in various metal lines, which are not enumerated here.

In order to solve the above technical problems, embodiments of the present disclosure provide the following solutions.

Figure 3:
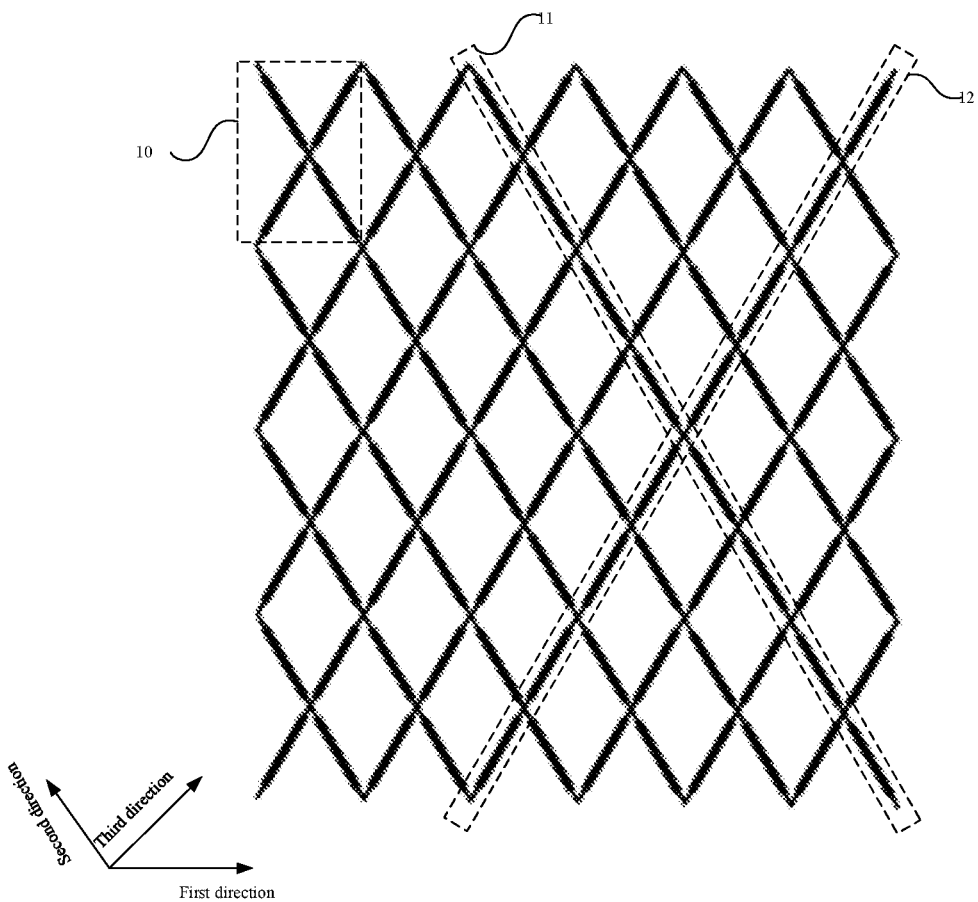
FIG. 3 is a top view of a metal mesh according to an embodiment of the present disclosure.

In a first aspect, FIG. 3 is a top view of a metal mesh according to an embodiment of the present disclosure. As shown in FIG. 3, an embodiment of the present disclosure provides a metal mesh, including a plurality of first metal lines 11 and a plurality of second metal lines 12 extending in crossed directions. The first metal lines 11 are arranged side by side in a first direction and each extend in a second direction. The second metal lines 12 are also arranged side by side in the first direction and each extend in a third direction. The second direction and the third direction are intersected, and each form an angle with the first direction.

Figure 4:
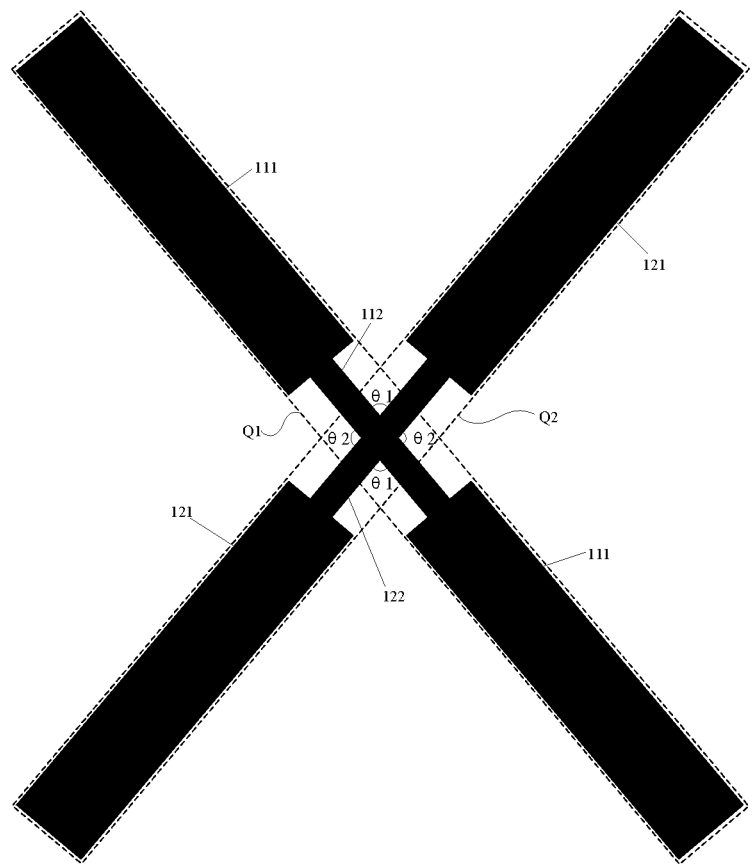
FIG. 4 is a schematic diagram of a crossed structure according to an embodiment of the present disclosure.

With continued reference to FIG. 3, each first metal line 11 includes a plurality of first sub-line segments sequentially connected together in the second direction and each extending in the second direction. Any adjacent two of the first sub-line segments in each first metal line 11 have a shared structure as half of their respective structures. Each second metal line 12 includes a plurality of second sub-line segments sequentially connected together in the third direction and each extending in the third direction. Any adjacent two of the second sub-line segments in each second metal line 12 have a shared structure as half of their respective structures. FIG. 4 is a schematic diagram of a crossed structure 10 according to an embodiment of the present disclosure. As shown in FIGS. 3 and 4, each first sub-line segment has a center superposing with a center of one of the second sub-line segments, the first sub-line segment and the second sub-line segment having superposed centers form a crossed structure 10, and define two first angles θ1 and two second angles θ2. Each first angle θ1 is not greater than each second angle θ2, and in the embodiments of the present disclosure, illustration is made by taking the first angle θ1 being smaller than the second angle θ2 as an example.

With continued reference to FIG. 4, the crossed structure 10 is divided into a first virtual quadrangle and a second virtual quadrangle. The first sub-line segment is arranged in the first virtual quadrangle, and the first virtual quadrangle has a width being a maximum width of the first sub-line segment, and a length being a length of the first sub-line segment. The second sub-line segment is arranged in the second virtual quadrangle, and the second virtual quadrangle has a width being a maximum width of the second sub-line segment, and a length being a maximum length of the second sub-line segment. For any crossed structure 10, the two sides defining each first angle θ1 are a first side and a second side, respectively, and a length of a connection line between a point S1 on the first side and a point S2 on the second side is a maximum distance L1 between the first side and the second side. The connection line between S1 and S2 intersects with a side of the first virtual quadrangle at a point S3, intersects with a side of the second virtual quadrangle at a point S4, and a connection line between S3 and S4 has a length L2; where L1>L2.

It will be appreciated that in the existing art, each first metal line 11 has a uniform line width. For example, the first metal line 11 has a line width at any position equal to the width of the first virtual quadrangle. However, as shown in FIG. 4, in the present application, by changing the line widths of the first sub-line segment and the second sub-line segment corresponding to the two sides that define the first angle $\theta_1$, the first angle $\theta_1$ formed by the first sub-line segment and the second sub-line segment is increased compared with that in the existing art, thereby effectively avoiding the problem that the transmittance of the metal mesh is reduced due to metal accumulation at the intersection of the first sub-line segment and the second sub-line segment.

In some examples, for each crossed structure 10, not only the first side and second side defining each two first angle $\theta_1$, but also the third side and fourth side defining each two second angle $\theta_2$, are changed compared with those in the existing art. A length of a connection line between a point S5 on the third side and a point S6 on the fourth side is a maximum distance L5 between the third side and the fourth side. The connection line between S5 and S6 intersects with a side of the first virtual quadrangle at a point S7, intersects with a side of the second virtual quadrangle at a point S8, and a connection line between S7 and S8 has a length L6; where L5>L6. In this case, the two second angles $\theta_2$ of the crossed structure 10 are further enlarged compared with those in the existing art. Thereby, the problem of metal accumulation at the intersection of the first sub-line segment and the second sub-line segment caused by the etching solution hard to enter the angle region can also be effectively avoided.

The following describes the metal mesh according to an embodiment of the present disclosure with reference to specific examples.

In an example, with continued reference to FIG. 4, the first sub-line segment in the crossed structure 10 includes two first branches 111, and a first connection part 112 connecting between the first branches 111. The first branches 111 and the first connection part 112 each extend in the second direction. The second sub-line segment includes two second branches 121, and a second connection part 122 connecting between the second branches 121. The second branches 121 and the second connection part 122 each extend in the third direction. The first connection part 112 intersects with the second connection part 122. As can be seen from FIG. 4, each first branch 111 has the same line width as each second branch 121, and the first connection part 112 has the same line width as the second connection part 122. Further, a straight line, running through a midpoint of the width of each first branch 111 and extending in the second direction, coincides with a straight line running through a midpoint of the width of the first connection part 112 and extending in the second direction. A straight line, running through a midpoint of the width of each second branch 121 and extending in the third direction, coincides with a straight line running through a midpoint of the width of the second connection part 122 and extending in the third direction. That is, the first sub-line segment forms an axisymmetric pattern with the straight line running through a midpoint of the maximum width of the first sub-line segment in the second direction as an axis of symmetry; and the second sub-line segment forms an axisymmetric pattern with the straight line running through a midpoint of the maximum width of the second sub-line segment in the third direction as an axis of symmetry. In this manner, not only the first angles $\theta_1$, but also the second angles $\theta_2$, in the crossed structure 10 are expanded compared to those in the existing structure, and thus, the problem of metal accumulation at the intersection of the first sub-line segment and the second sub-line segment can be avoided as much as possible.

Figure 5:
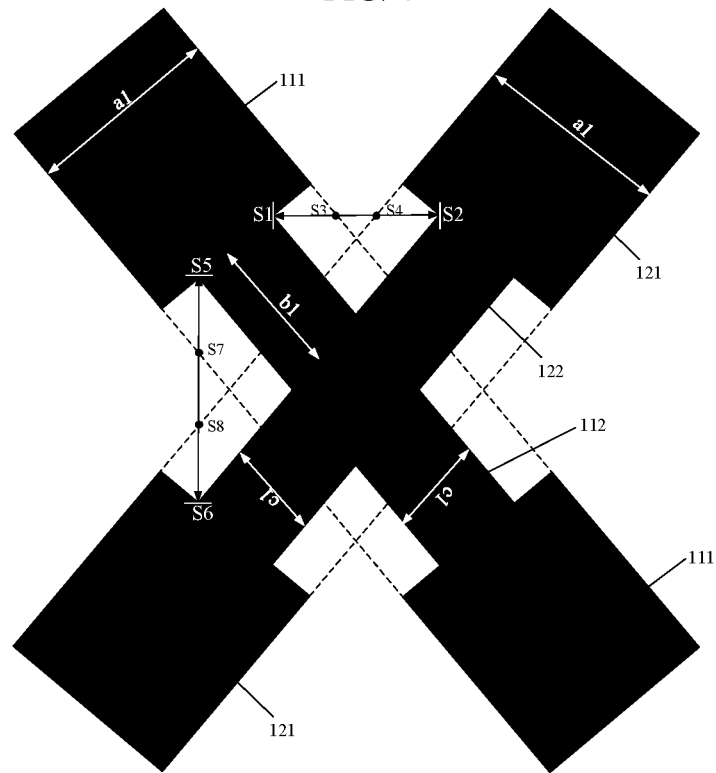
FIG. 5 is an enlarged view of a portion of the crossed structure shown in FIG. 4.

In some examples, FIG. 5 is an enlarged view of a portion of FIG. 4. As shown in FIG. 5, the first branches 111 and the second branches 121 each may have a width a1, the first side and the second side of the first connection part 112 and the second connection part 122 defining each first angle $\theta_1$ each have a length b1, and the first connection part 112 and the second connection part 122 each have a width c1; where $3a1<b1<5a1$; and $0.6a1<c1<0.8a1$. By reasonably designing the line width and the length of each of the first connection part 112 and the second connection part 122 as above, the optical transmittance of the metal mesh can be optimized.

In some examples, the connection line between S1 and the S2 defines an area A with the first sub-line segment and the second sub-line segment, and the connection line between S5 and the S6 defines an area B with the first sub-line segment and the second sub-line segment; and the first sub-line segment and the second sub-line segment have an intersection area C; where $(A+B):C \leq 1:2$ (i.e., $(A+B)/C \leq \frac{1}{2}$). By reasonably setting the line width of each of the first sub-line segment and the second sub-line segment at each position, the problem of reduced optical performance due to a large intersection area of the first sub-line segment and the second sub-line segment can be avoided.

Figure 6:
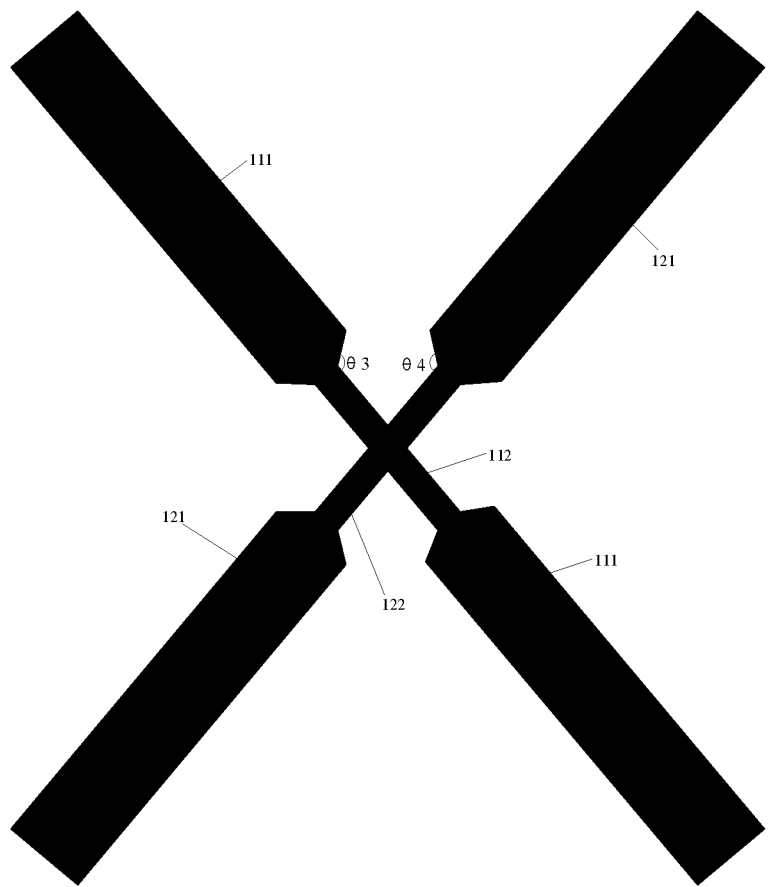
FIG. 6 is a schematic diagram of another crossed structure according to an embodiment of the present disclosure.

In another example, FIG. 6 is a schematic diagram of another crossed structure 10 according to an embodiment of the present disclosure. As shown in FIG. 6, this crossed structure 10 is substantially the same as the crossed structure 10 shown in FIG. 4, except that each first branch 111 of the first sub-line segment forms a dihedral angle (interfacial angle) $\theta_3$, which is an obtuse angle, with the first connection part 112 of the first sub-line segment. Such arrangement is provided because each first branch 111 and the first connection part 112 have different line widths, and connection between each first branch 111 and the first connection part 112 is equivalent to introducing the angle $\theta_3$ at the connection. If the angle $\theta_3$ is too small, it will also cause the etching solution hard to enter the angle $\theta_3$ during etching, resulting in the problem of metal accumulation at the connection between each first branch 111 and the first connection part 112. Similarly, each second branch 121 forms an obtuse dihedral angle $\theta_4$ with the second connection part 122. The principle thereof is the same as the foregoing, and thus is not repeated here.

Figure 7:
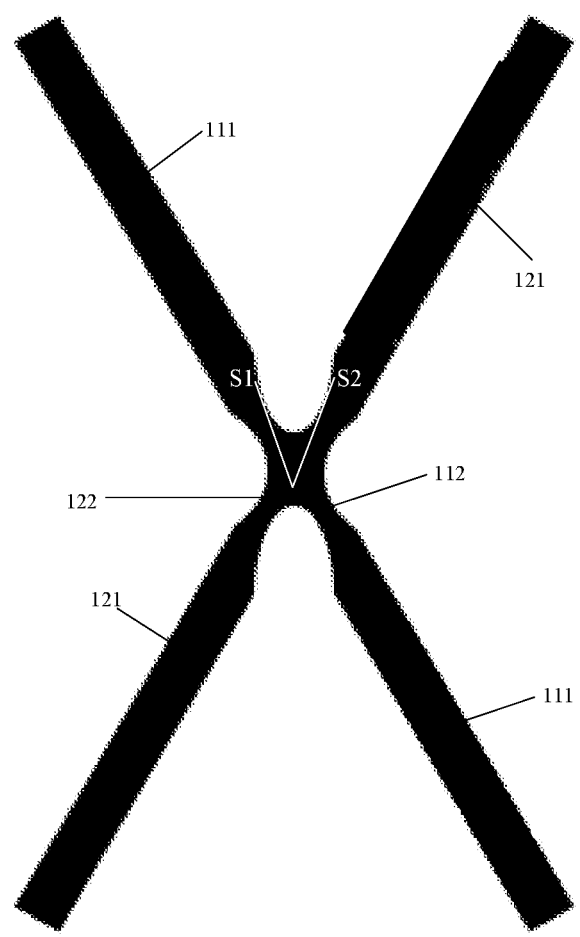
FIG. 7 is a schematic diagram of another crossed structure according to an embodiment of the present disclosure.

In another example, FIG. 7 is a schematic diagram of another crossed structure 10 according to an embodiment of the present disclosure. As shown in FIG. 7, the first angles $\theta_1$ and the second angles $\theta_2$ in this crossed structure 10 are all rounded chamfers. In this case, the first side and the second side forming each first angle $\theta_1$ are connected into an integral structure (i.e., a one-piece structure) to form a segment of circular arc. The third side and the fourth side forming each second angle $\theta_2$ are also connected to form a segment of circular arc. In this case, since the first angles $\theta_1$ and the second angles $\theta_2$ are changed from sharp angles to rounded chamfers, equivalent to expanding the angles, compared with the existing art, the problem of metal accumulation at the connection of each first branch 111 and the first connection part 112 caused by the etching solution hard to enter the intersection due to a too small angle at the intersection can be effectively avoided. It should be noted here that in this example, the illustration is made by taking the case where the first angles $\theta_1$ and the second angles $\theta_2$ are all rounded chamfers as an example, but in actual products, since each first angle $\theta_1$ is smaller than each second angle θ2, it is also possible to provide only the first angles θ1 as rounded chamfers.

In some examples, referring to FIG. 7, a distance L3 is provided between an intersection point of extension lines of the first side and the second side and a vertex of the first angle θ1, and a distance L4 is provided between the intersection point of the extension lines of the first side and the second side and a center of an intersection region of the first sub-line segment and the second sub-line segment; where L3:L4=1:10 to 1:2. With such arrangement, it can be ensured that the line widths of the first connection part 112 and the second connection part 122 satisfy the requirements of conductive performance, while improving the optical performance of the metal mesh.

It should be noted here that the extension lines of the first side and the second side refer to extension lines of the tangents of the first side and the second side at points S1 and S2, i.e., the farthest points between the first side and the second side, respectively.

In some examples, in the crossed structure 10, both the two first angles θ1 and both the two second angles θ2 are flat chamfers. In this case, since the first angles θ1 and the second angles θ2 are changed from sharp angles to flat chamfers, equivalent to expanding the angles, compared with the existing art, the problem of metal accumulation at the connection of each first branch 111 and the first connection part 112 caused by the etching solution hard to enter the connection due to a too small angle at the intersection can be effectively avoided.

It should be noted here that in this example, the illustration is made by taking the case where the first angles θ1 and the second angles θ2 are all flat chamfers as an example, but in actual products, since each first angle θ1 is smaller than each second angle θ2, it is also possible to provide only the first angles θ1 as flat chamfers.

Figure 8:
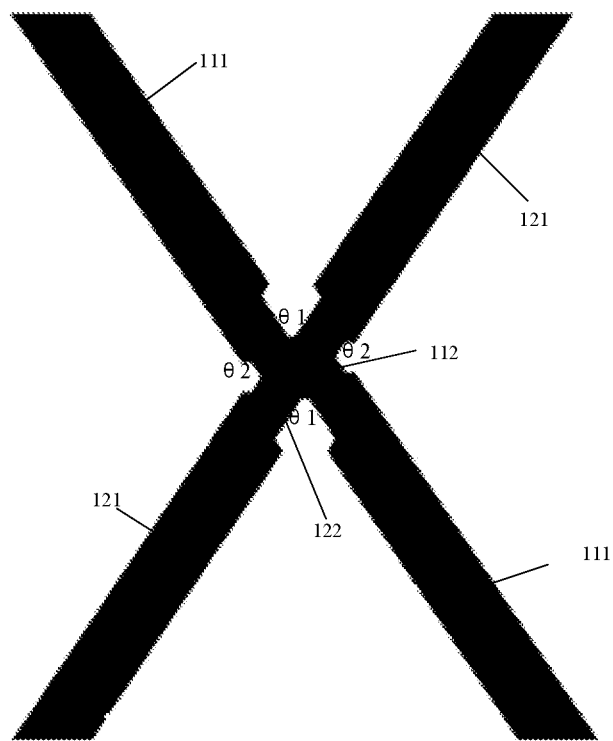
FIG. 8 is a schematic diagram of another crossed structure according to an embodiment of the present disclosure.

In another example, FIG. 8 is a schematic diagram of another crossed structure 10 according to an embodiment of the present disclosure. As shown in FIG. 8, this crossed structure 10 is substantially the same as the crossed structure 10 shown in FIG. 4, except that the first connection part 112 and the second connection part 122 in this crossed structure 10 are both patterns of a non-uniform line width. Further, the extension direction of the connection line between the two second angles θ2 forms an angle with the first direction. That is, the two second angles θ2 are not strictly opposite to each other, leading to an increased distance between the two second angles θ2. In this case, although the first connection part 112 and the second connection part 122 are designed to have smaller line widths, the problem of poor electrical connection between the first sub-line segment and the second sub-line segment due to a relatively small intersection area of the first connection part 112 and the second connection part 122 can be effectively avoided.

In some examples, with continued reference to FIG. 8, the first angles θ1 and the second angles θ2 in the crossed structure 10 may have different shapes. For example, the two first angles θ1 are sharp angles, and the two second angles θ2 are rounded chamfers. Alternatively, it is also possible that the first angles θ1 are rounded chamfers, and the second angles θ2 are sharp angles, and so on. The specific shapes of the first angles θ1 and the second angles θ2 may be specifically set according to the requirements of the product.

Figure 9:
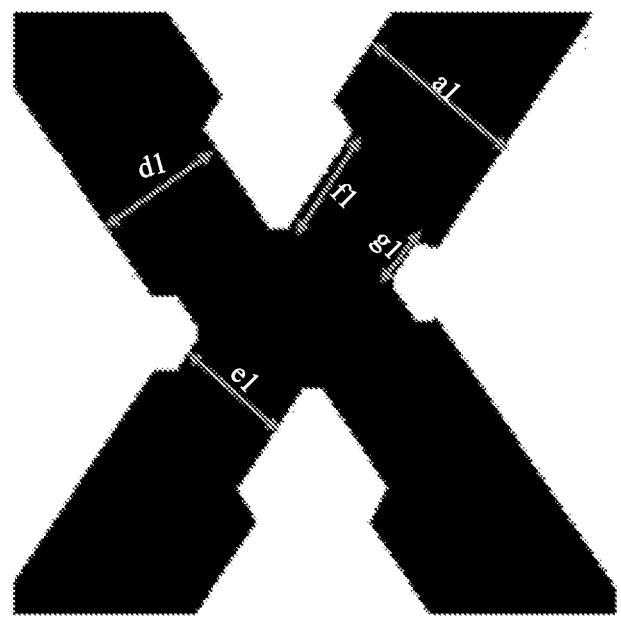
FIG. 9 is an enlarged view of a portion of the crossed structure shown in FIG. 8.

In some examples, FIG. 9 is an enlarged view of a portion of FIG. 8. As shown in FIG. 9, in the crossed structure 10, the first branches 111 and the second branches 121 each have a maximum width a1, the first connection part 112 has a maximum width d1, the second connection part 122 has a maximum width e1, the first side and the second side each have a length f1, and the third side and the fourth side each have a length g1, where $0.7a1<d1<0.9a1$, $0.65a1<f1<0.85a1$, $0.7d1<e1<0.9d1$, and $0.2f1<g1<0.5f1$. In this case, by adjusting positions of the sides defining the first angles θ1 and the second angles θ2, the problem that the etching solution is hard to enter the angles is effectively avoided.

Figure 10:
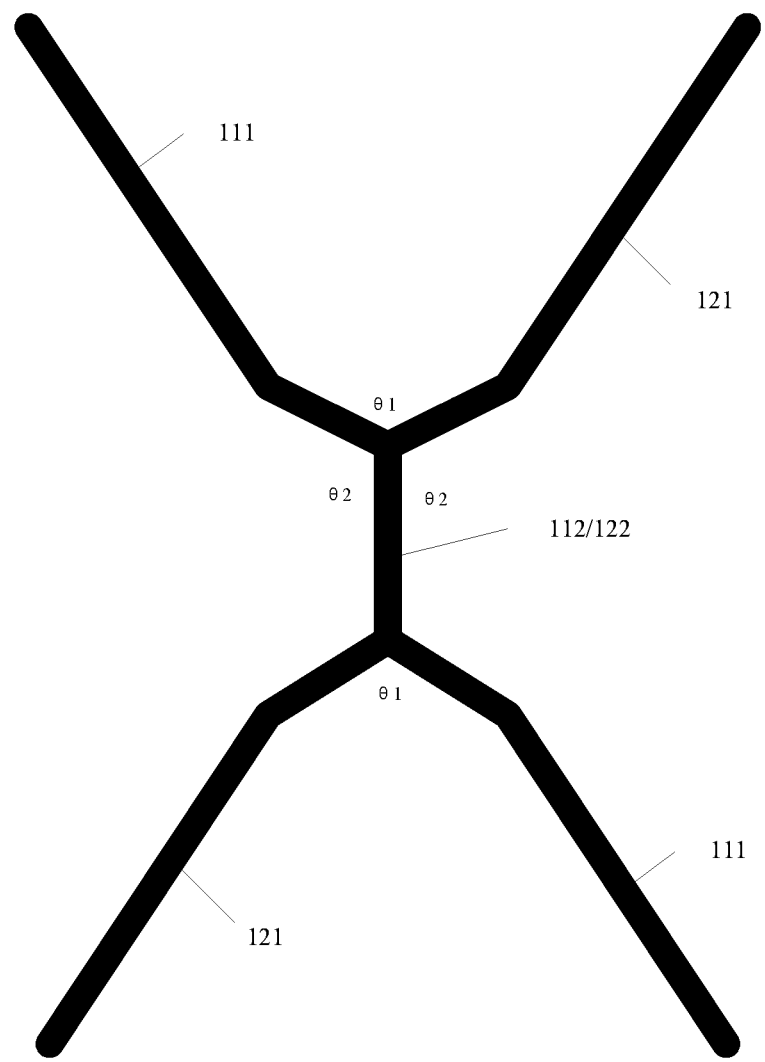
FIG. 10 is a schematic diagram of another crossed structure according to an embodiment of the present disclosure.

In some examples, FIG. 10 is a schematic view of another crossed structure 10 according to an embodiment of the present disclosure. As shown in FIG. 10, the first sub-line segment in the crossed structure 10 includes two first branches 111, and a first connection part 112 connecting between the first branches 111; and the second sub-line segment includes two second branches 121, and a second connection part 122 connecting between the second branches 121. The first connection part 112 and the second connection part 122 each include a first portion, a second portion, and a third portion connected together in sequence, and the second portion of the first connection part 112 and the second portion of the second connection part 122 are a shared portion. One of the first branches 111 is connected to the first portion of the first connection part 112 to form an obtuse dihedral angle therebetween, and the other first branch 111 is connected to the third portion of the first connection part 112 to form an obtuse dihedral angle therebetween. One of the second branches 121 is connected to the first portion of the second connection part 122 to form an obtuse dihedral angle therebetween, and the other second branch 121 is connected to the third portion of the second connection part 122 to form an obtuse dihedral angle therebetween. In this case, the two first angles θ1 in the crossed structure 10 are both sharp and obtuse angles, and the two second angles θ2 are straight angles. Since each angle in this crossed structure 10 is relatively large, the problem that the etching solution is hard to enter the angle position during etching to cause metal accumulation and thus affect optical properties of the metal mesh can be effectively avoided.

In some examples, with continued reference to FIG. 10, the second portion of the first connection part 112 (or the second connection part 122) has a line width and a line length not less than twice the line width. By reasonably setting the line length of the second portion, it is ensured that the formed flat chamfer will not to be too small.

Figure 11:
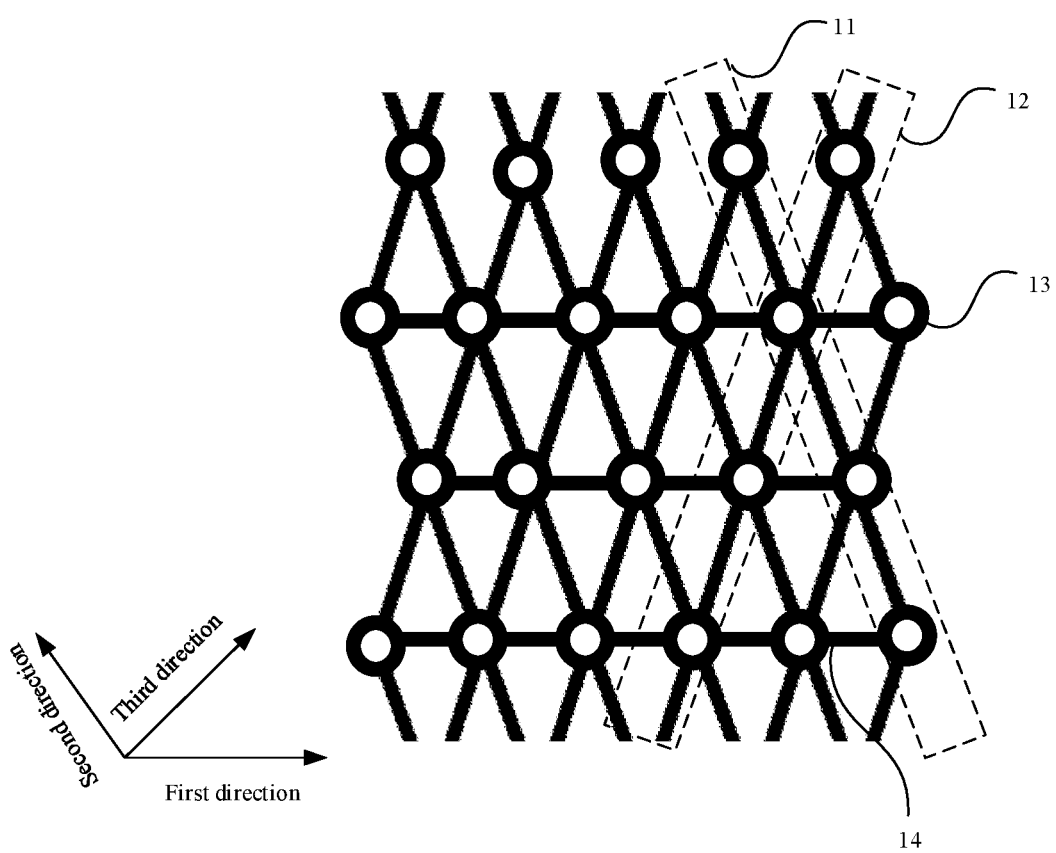
FIG. 11 is a top view of another metal mesh according to an embodiment of the present disclosure.
Figure 12:
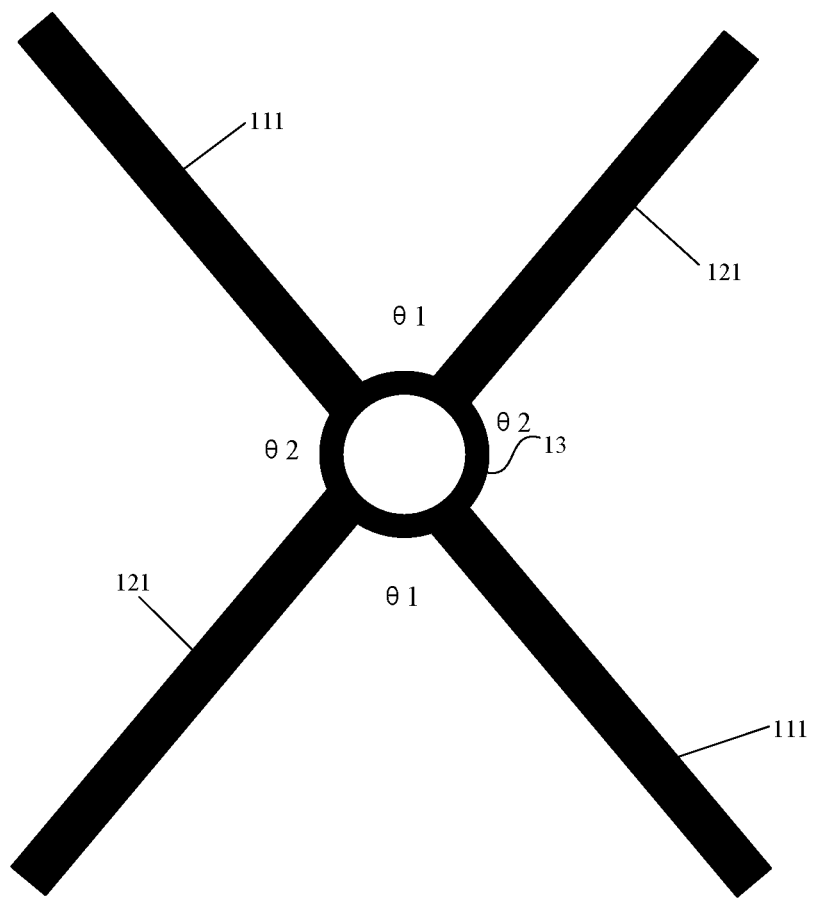
FIG. 12 is a schematic diagram of another crossed structure according to an embodiment of the present disclosure.

In another example, FIG. 11 is a top view of another metal mesh according to an embodiment of the present disclosure; and FIG. 12 is a schematic view of another crossed structure 10 according to an embodiment of the present disclosure. As shown in FIGS. 11 and 12, each crossed structure 10 in the metal mesh includes a first sub-line segment and a second sub-line segment arranged in a crossed manner (i.e., arranged to cross each other), and a first annular connection part 13. The first sub-line segment includes two first branches 111 arranged in a disconnected manner (i.e., arranged to be spaced apart from each other) in a second direction, and the second sub-line segment includes two second branches 121 arranged in a disconnected manner in a third direction. The first annular connection part 13 is connected to the two first branches 111 and the two second branches 121 at a position where the two first branches 111 and the two second branches 121 are disconnected from each other. As can be seen from FIG. 11, the two first branches 111 and the two second branches 121 are connected to the first annular connection part 13 at different nodes from each other. That is, a distance is provided between the adjacent first branch 111 and second branch 121. Therefore, the problem that the etching solution is hard to enter the angle position during etching to cause metal accumulation and thus affect optical properties of the metal mesh can be effectively avoided.

In some examples, with continued reference to FIGS. 11 and 12, the first metal lines 11 and the second metal lines 12 of the metal mesh in the embodiment of the present disclosure are arranged in a crossed manner to form a plurality of mesh structures, and a first bridge part 14 is connected between two opposite and larger angles (e.g., two opposite second angles θ2) in the mesh structures. Specifically, the first bridge part 14 is connected to adjacent two of the first annular connection parts 13. By providing the first bridge part 14, toughness of the metal mesh is enhanced.

In some examples, the first annular connection part 13 may be a circular first annular connection part 13, with which formation of sharp corners can be reduced as much as possible, thereby effectively avoiding the problem that the etching solution is hard to enter a position of intersection. Alternatively, in the embodiments of the present disclosure, the first annular connection part 13 may be of a rectangle, or the like. The specific shape of the first annular connection part 13 is not limited in the embodiments of the present disclosure.

In some examples, the first annular connection part 13 in an embodiment of the present disclosure is a circular first annular connection part 13 having an inner diameter ranging from 45 μm to 65 μm, an outer diameter ranging from 65 μm to 80 μm, and a line width of 10 μm to 25 μm.

For example: in the case of a metal mesh having a first annular connection part 13 that is of a circle, the mask adopted has the same shape as the metal mesh, and when a circular annular light-shielding part of the mask has an outer diameter of 80 μm and an inner diameter of 60 μm, the formed first annular connection part 13 by etching has an outer diameter of 72 μm, an inner diameter of 58 μm, and a line width of 14 μm. It is verified through experiments that the etching is substantially thorough at the connections of the first branches 111, the second branches 121 and the first annular connection part 13, and no metal is accumulated.

For example: in the case of a metal mesh having a circular first annular connection part 13, the mask adopted has the same shape as the metal mesh, and when the circular annular light-shielding part of the mask has an outer diameter of 85 μm and an inner diameter of 65 μm, the formed first annular connection part 13 by etching has an outer diameter of 77 μm, an inner diameter of 62 μm, and a line width of 15 μm. It is verified through experiments that the etching is substantially thorough at the connections of the first branches 111, the second branches 121 and the first annular connection part 13, and no metal is accumulated.

In a second aspect, an embodiment of the present disclosure provides a thin film sensor, including the metal mesh as described above. The thin film sensor has better optical properties since it includes the metal mesh.

The thin film sensor in the embodiment of the present disclosure may be a transparent antenna, or may be a touch substrate, or the like.

Figure 13:
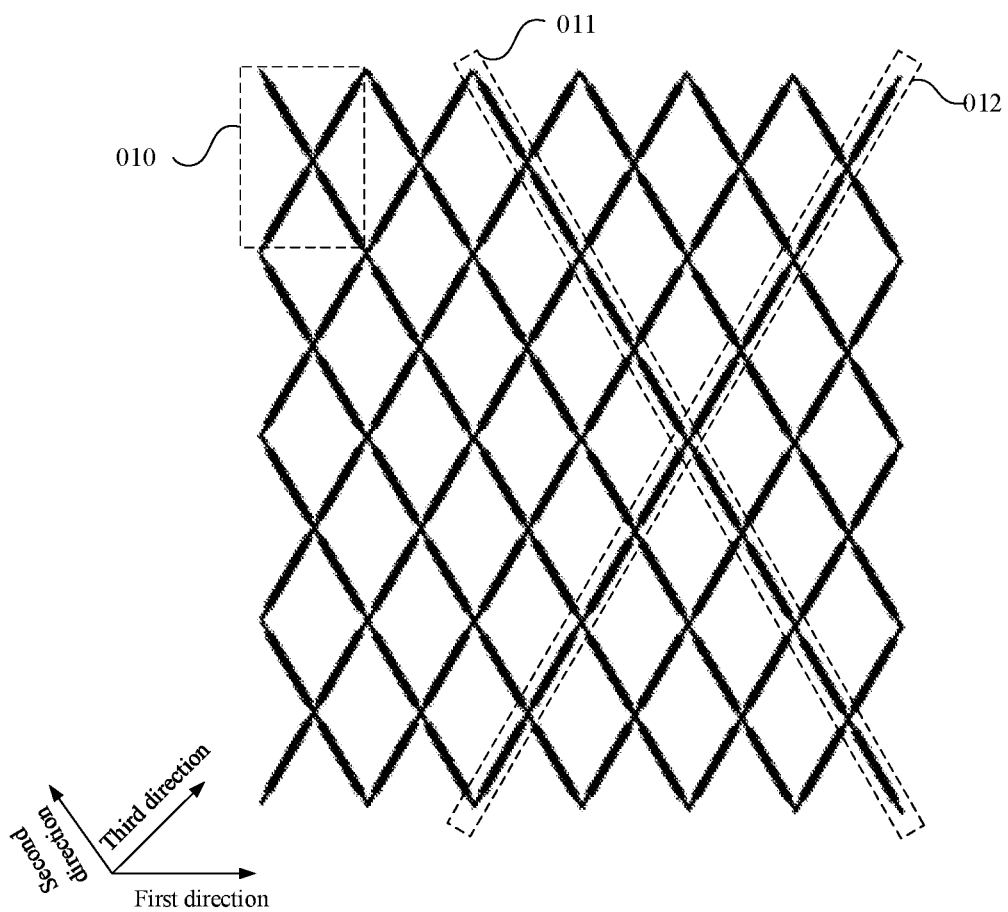
FIG. 13 is a schematic diagram of a mask according to an embodiment of the present disclosure.

In a third aspect, FIG. 13 is a schematic diagram of a mask according to an embodiment of the present disclosure. As shown in FIG. 13, an embodiment of the present disclosure provides a mask that can be used to prepare any one of the above metal meshes. The mask includes a light-shielding part and a light-transmitting part. The light-shielding part includes a plurality of first light-shielding strips 011 and a plurality of second light-shielding strips 012 arranged in a crossed manner. The plurality of first light-shielding strips 011 extend in a second direction and arranged side by side in a first direction. The plurality of second light-shielding strips 012 extend in a third direction and arranged side by side in the first direction. A maximum width of each first light-shielding strip 011 is a first width, and a maximum width of each second light-shielding strip 012 is a second width. Each first light-shielding strip 011 includes a plurality of first sub-shielding strips 0111 arranged in the second direction, each of which extends in the second direction and has a width equal to the first width. Each second light-shielding strip 012 includes a plurality of second sub-shielding strips 0121 arranged in the third direction, each of which extends in the third direction and has a width equal to the second width. A distance is provided between any adjacent two of the first sub-shielding strips 0111 on any one of the first light-shielding strips 011. Any adjacent two of the first sub-shielding strips 0111 form a first sub-shielding part 1110 having a first end and a second end disposed oppositely. A distance is provided between any adjacent two of the second sub-shielding strips 0121 on any one of the second light-shielding strips 012. Any adjacent two of the second sub-shielding strips 0121 form a second sub-shielding part 1210 having a third end and a fourth end disposed oppositely. The light-shielding part further includes at least one first light-shielding unit 010 each including a first sub-shielding part 1110 and a second sub-shielding part 1210 arranged in a crossed manner. The first end and the second end are centrosymmetric relative to a first symmetry point. In the first light-shielding unit 010, the two second sub-shielding strips 0121 include a third end and a fourth end disposed oppositely, and the third end and the fourth end are centrosymmetric relative to a second symmetry point.

In the mask provided in the embodiment of the present disclosure, a distance is provided between any adjacent two of the first sub-shielding strips 0111 on any one of the first light-shielding strips 011. Any adjacent two of the first sub-shielding strips 0111 form a first sub-shielding part 1110 having a first end and a second end disposed oppositely. A distance is provided between any adjacent two of the second sub-shielding strips 0121 on any one of the second light-shielding strips 012. Any adjacent two of the second sub-shielding strips 0121 form a second sub-shielding part 1210 having a third end and a fourth end disposed oppositely. The light-shielding part of the mask further includes at least one first light-shielding unit 010 each including a first sub-shielding part 1110 and a second sub-shielding part 1210 arranged in a crossed manner. The first end and the second end are centrosymmetric relative to a first symmetry point. In the first light-shielding unit 010, the two second sub-shielding strips 0121 include a third end and a fourth end disposed oppositely, and the third end and the fourth end are centrosymmetric relative to a second symmetry point. The mask with this structure can prevent metal accumulation at intersections of the formed metal mesh.

The following description is made with reference to specific examples.

Figure 14:
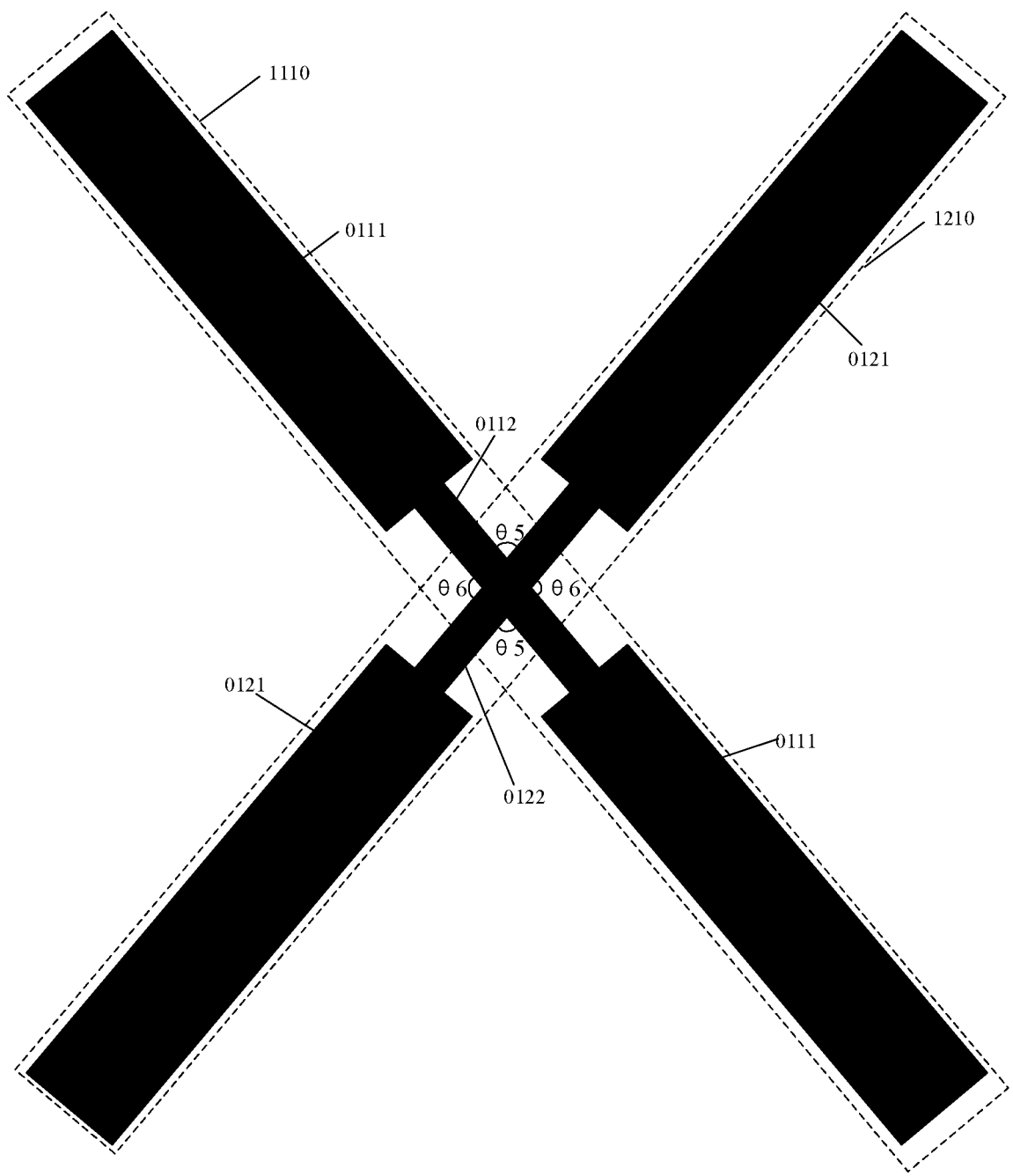
FIG. 14 is a schematic diagram of a first light-shielding unit in a mask according to an embodiment of the present disclosure.
Figure 15:
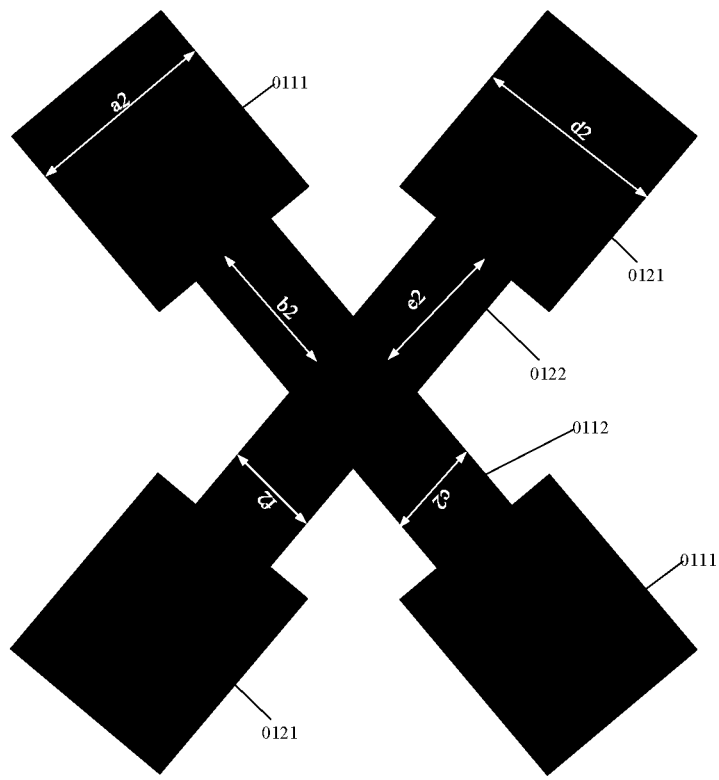
FIG. 15 is an enlarged schematic view of FIG. 14.

In an example, FIG. 14 is a schematic diagram of a first light-shielding unit in a mask according to an embodiment of the present disclosure, and FIG. 15 is an enlarged schematic view of FIG. 14. As shown in FIGS. 14 and 15, the mask may be used to prepare the metal mesh shown in FIG. 4. In this mask, each first light-shielding strip 011 includes not only the plurality of first sub-shielding strips 0111 arranged in the second direction, but also a third connection part 0112 connected between any adjacent two of the first sub-shielding strips 0111. Each second light-shielding strip 012 includes not only the second sub-shielding strips 0121 arranged in the third direction, but also a fourth connection part 0122 connected between any adjacent two of the second sub-shielding strips 0121. The third connection part 0112 and the fourth connection part 0122 in each first light-shielding unit 010 are arranged in a crossed manner. Each first sub-shielding strip 0111 has a width a2, and the third connection part 0112 has a length b2 and a width c2; where $1.5a2<b2<2.5a2$; and $0.6a2<c2<0.8a2$. Each second sub-shielding strip 0121 has a width d2, and the fourth connection part 0122 has a length e2 and a width f2; where $1.5d2<e2<2.5d2$; and $0.6d2<f2<0.8d2$. The width a2 of the first sub-shielding strip 0111 is equal to the width d2 of the second sub-shielding strip 0121. The length b2 of the third connection part 0112 is equal to the length e2 of the fourth connection part 0122. The width c2 of the third connection part 0112 is equal to the width f2 of the fourth connection part 0122.

It should be noted that each of the above widths refers to the maximum width of the corresponding structure, and each of the above lengths refers to the maximum length of the corresponding structure. The first sub-shielding strip 0111 corresponds to the first branch formed in FIG. 4, the second sub-shielding strip 0121 corresponds to the second branch formed in FIG. 4, the third connection part 0112 corresponds to the first connection part formed in FIG. 4, and the fourth connection part 0122 corresponds to the second connection part formed in FIG. 4.

Figure 16:
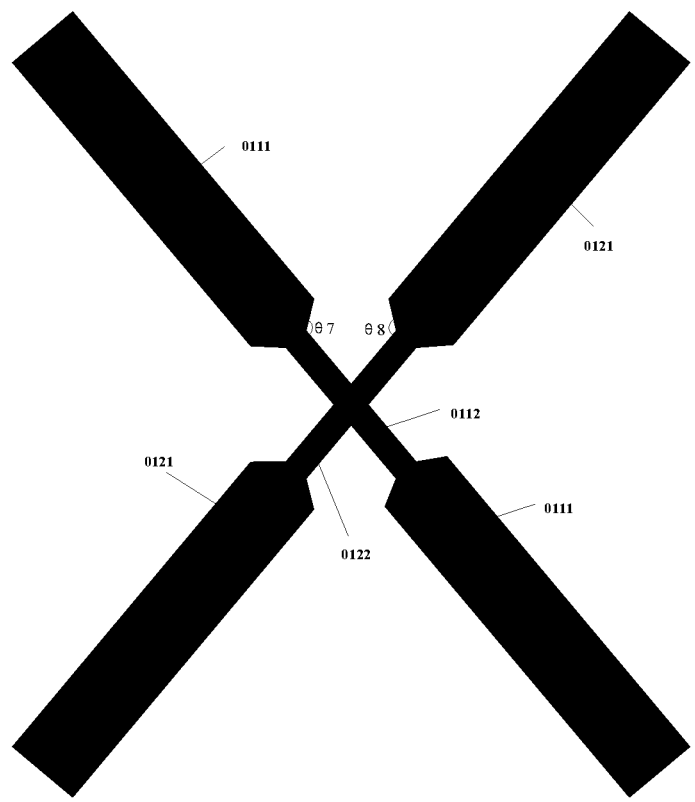
FIG. 16 is a schematic diagram of a first light-shielding unit in another mask according to an embodiment of the present disclosure.

In another example, FIG. 16 is a schematic diagram of a first light-shielding unit in another mask according to an embodiment of the present disclosure. As shown in FIG. 16, the mask may be used to prepare the metal mesh shown in FIG. 6. The only difference is that each first sub-shielding strip 0111 forms an obtuse dihedral angle θ7 with the third connection part 0112. Such arrangement is provided because each first sub-shielding strip 0111 and the third connection part 0112 have different line widths, and connection of each first sub-shielding strip 0111 and the third connection part 0112 is equivalent to introducing an angle at the connection. If the angle is too small, it will also cause the etching solution hard to enter the angle during etching, resulting in the problem of metal accumulation at the connection between each first sub-shielding strip 0111 and the third connection part 0112. Similarly, each second sub-shielding strip 0121 forms an obtuse dihedral angle θ8 with the fourth connection part 0122. The principle thereof is the same as the foregoing, and thus is not repeated here.

Figure 17:
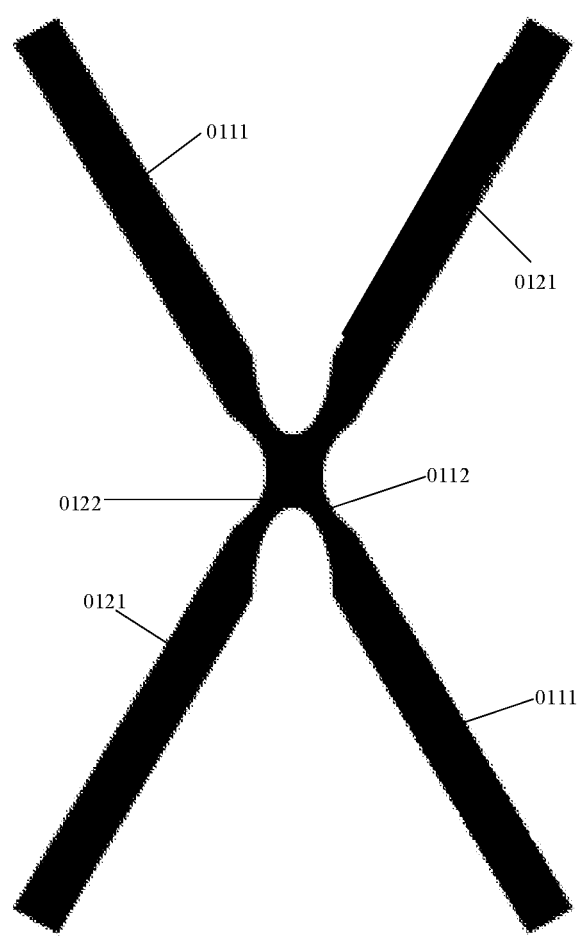
FIG. 17 is a schematic diagram of a first light-shielding unit in another mask according to an embodiment of the present disclosure.

In another example, FIG. 17 is a schematic diagram of a first light-shielding unit 010 in another mask according to an embodiment of the present disclosure. As shown in FIG. 17, the mask may be used to prepare the metal mesh shown in FIG. 7. The first light-shielding part and the second light-shielding part in the first light-shielding unit 010 are arranged in a crossed manner to define two opposite third angles θ5 and two opposite fourth angles θ6. Each third angle θ5 is not larger than each fourth angle θ6, and all angles are rounded chamfers. In this case, since the third angles θ5 and the fourth angles θ6 are changed from sharp angles to rounded chamfers, equivalent to expanding the angles, compared with the existing art, the problem of metal accumulation at the connection of each first branch and the first connection part caused by the etching solution hard to enter the connection due to a too small angle at the intersection can be effectively avoided. It should be noted here that in this example, the illustration is made by taking the case where the third angles θ5 and the fourth angles θ6 are all rounded chamfers as an example, but in actual products, since each third angle θ5 is smaller than each fourth angle θ6, it is also possible to provide only the third angles θ5 as rounded chamfers.

Figure 18:
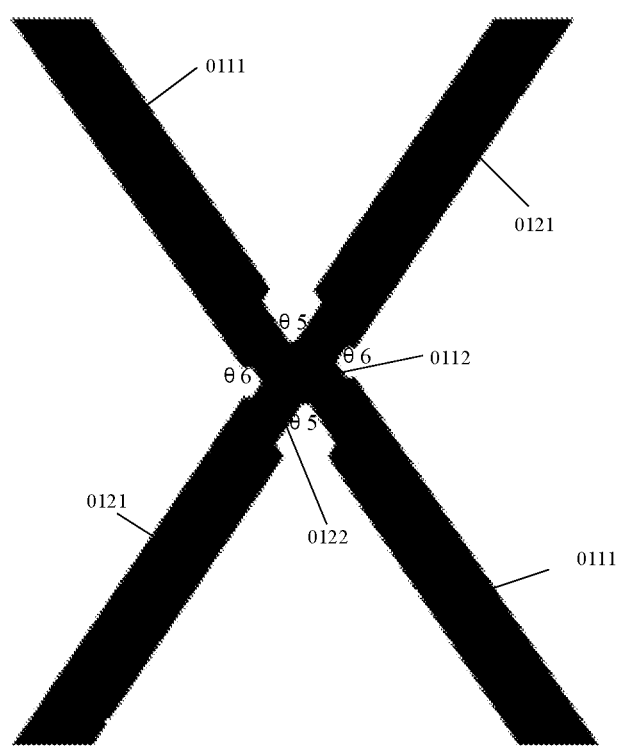
FIG. 18 is a schematic diagram of a first light-shielding unit in another mask according to an embodiment of the present disclosure.

In another example, FIG. 18 is a schematic diagram of a first light-shielding unit in another mask according to an embodiment of the present disclosure. As shown in FIG. 18, the mask may be used to prepare the metal mesh shown in FIG. 8. As shown in FIGS. 8 and 18, this first light-shielding unit 010 is substantially the same as the first light-shielding unit 010 shown in FIG. 17, except that the third connection part 0112 and the fourth connection part 0122 of the first light-shielding unit 010 are both patterns of a non-uniform line width. Further, the extension direction of the connection line between the two fourth angles θ6 forms an angle with the second direction. That is, the two fourth angles θ6 are not strictly opposite to each other, leading to an increased distance between the two fourth angles θ6. That is, the distance between the two second angles in the formed crossed structure is increased. In this case, although the third connection part 0112 and the fourth connection part 0122 are designed to have smaller line widths, the conductive performance of the formed metal mesh is not affected.

Figure 19:
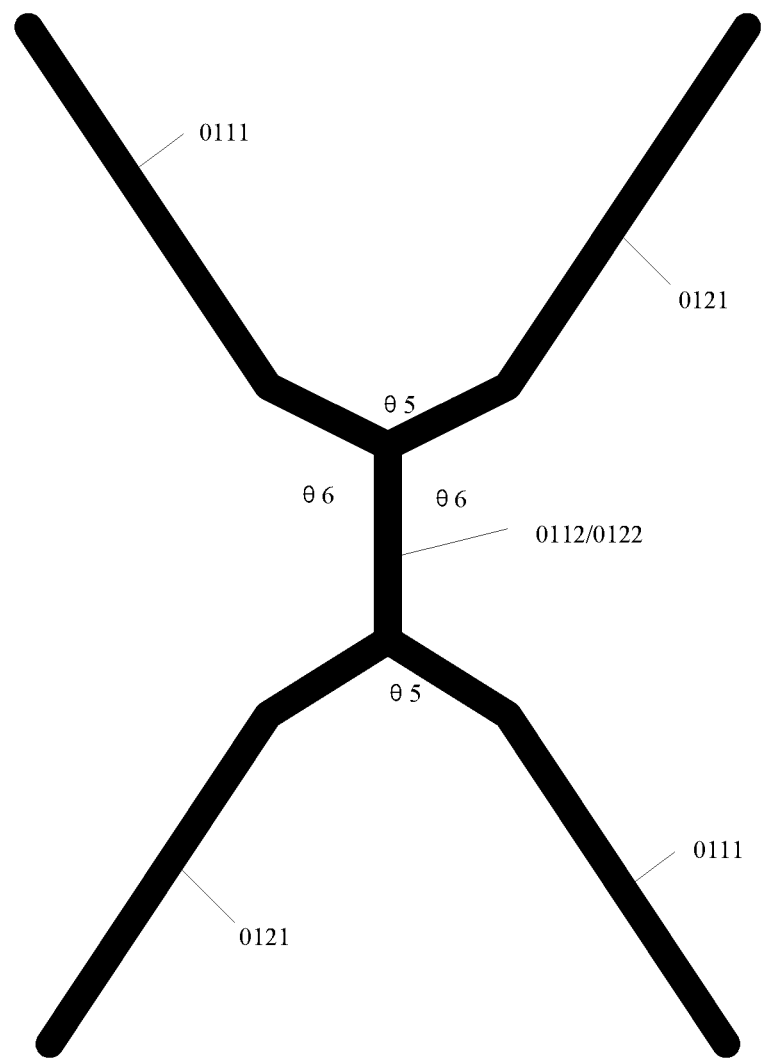
FIG. 19 is a schematic diagram of a first light-shielding unit in another mask according to an embodiment of the present disclosure.

In another example, FIG. 19 is a schematic diagram of a first light-shielding unit 010 in another mask according to an embodiment of the present disclosure. As shown in FIG. 19, the mask may be used to prepare the metal mesh shown in FIG. 10. As shown in FIGS. 10 and 19, in the first light-shielding unit 010, the first sub-shielding part 1110 includes two first sub-shielding strips 0111, and a third connection part 0112 connected between the two first sub-shielding strips 0111. The second sub-shielding part 1210 includes two second sub-shielding strips 0121, and a fourth connection part 0122 connected between the two second sub-shielding strips 0121. The third connection part 0112 and the fourth connection part 0122 each include a first portion, a second portion, and a third portion connected together in sequence, and the second portion of the third connection part 0112 and the second portion of the fourth connection part 0122 are a shared portion. One of the first sub-shielding strips 0111 is connected to the first portion of the third connection part 0112 to form an obtuse dihedral angle therebetween, and the other first sub-shielding strip 0111 is connected to the third portion of the third connection part 0112 to form an obtuse dihedral angle therebetween. One of the second sub-shielding strips 0121 is connected to the first portion of the fourth connection part 0122 to form an obtuse dihedral angle therebetween, and the other second sub-shielding strip 0121 is connected to the third portion of the fourth connection part 0122 to form an obtuse dihedral angle therebetween. In this case, the two third angles θ5 in the first light-shielding unit 010 are both sharp and obtuse angles, and the two fourth angles θ6 are straight angles. Since each angle in this first light-shielding unit 010 is relatively large, the problem that the etching solution is hard to enter the angle position during etching to cause metal accumulation and thus affect optical properties of the metal mesh can be effectively avoided.

In some examples, with continued reference to FIG. 19, the second portion of the third connection part 0112 (or the fourth connection part 0122) has a line width and a line length not less than twice the line width. By reasonably setting the line length of the second portion as above, it is ensured that the formed flat chamfer will not to be too small.

Figure 20:
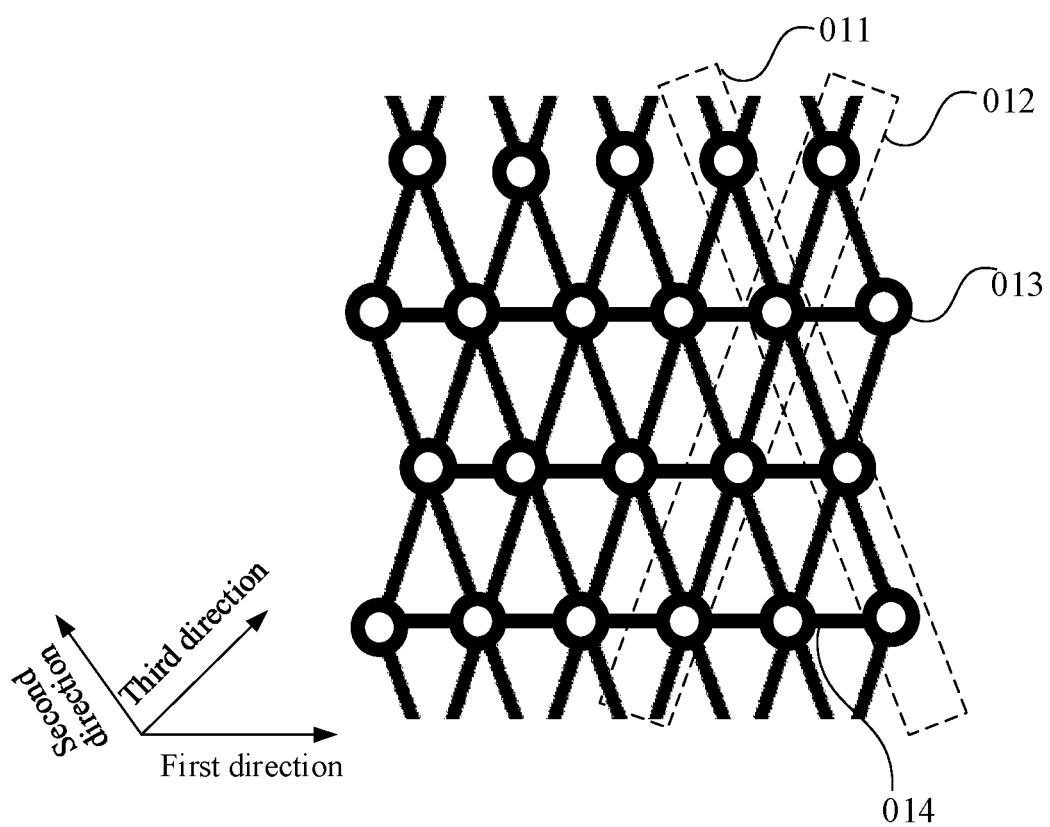
FIG. 20 is a schematic diagram of another mask according to an embodiment of the present disclosure.

In another example, FIG. 20 is a schematic diagram of another mask according to an embodiment of the present disclosure. As shown in FIG. 20, the mask may be used to prepare the metal mesh shown in FIG. 11. As shown in FIGS. 11 and 20, the first light-shielding unit 010 in this mask includes a first sub-shielding part 1110 and a second sub-shielding part 1210 arranged in a crossed manner, and a second annular connection part 013. The first sub-shielding part 1110 includes two first sub-shielding strips 0111 arranged in a disconnected manner in the second direction, and the second sub-shielding part 1210 includes two second sub-shielding strips 0121 arranged in a disconnected manner in the third direction. The second annular connection part 013 is connected to the two first sub-shielding strips 0111 and the two second sub-shielding strips 0121 at a position where the two first sub-shielding strips 0111 and the two second sub-shielding strips 0121 are disconnected from each other. As can be seen from FIG. 20, the two first sub-shielding strips 0111 and the two second sub-shielding strips 0121 are connected to the second annular connection part 013 at different nodes from each other. That is, a distance is provided between the adjacent first sub-shielding strip 0111 and second sub-shielding strip 0121. Therefore, the problem that the etching solution is hard to enter the angle position during etching to cause metal accumulation and thus affect optical properties of the metal mesh can be effectively avoided.

As shown in FIG. 20, the second circular annular connection part 013 may be a circular annular connection part, with which formation of sharp corners can be reduced as much as possible, thereby effectively avoiding the problem that the etching solution is hard to enter an intersection position. Alternatively, in an embodiment of the present disclosure, the second annular connection part 013 may be a rectangular annular connection part, or the like. The specific shape of the second annular connection part 013 is not limited in the embodiments of the present disclosure.

In some examples, as shown in FIG. 20, in each first light-shielding unit 010, the second annular connection part 013 connects the two first sub-shielding strips 0111 and the two second sub-shielding strips 0121 in the first light-shielding unit 010 together, and defines two opposite third angles θ5 and two opposite fourth angles θ6. Each third angle θ5 is not larger than each fourth angle θ6, and a second bridge part 014 is connected between the two opposite fourth angles θ6. The second bridge part 014 corresponds to the first bridge part shown in FIG. 11, so as to enhance toughness of the formed metal mesh.

It will be appreciated that the above implementations are merely exemplary implementations for the purpose of illustrating the principle of the present disclosure, and the present disclosure is not limited thereto. It will be apparent to one of ordinary skill in the art that various modifications and variations can be made to the present disclosure without departing from the spirit or essence of the present disclosure. Such modifications and variations should also be considered as falling into the protection scope of the present disclosure.

What is claimed is:

1. A metal mesh, comprising: a plurality of first metal lines and a plurality of second metal lines extending in crossed directions; wherein the first metal lines are arranged side by side in a first direction and extend in a second direction; the second metal lines are arranged side by side in the first direction and extend in a third direction; and wherein each first metal line comprises a plurality of first sub-line segments sequentially connected together in the second direction, and each second metal line comprises a plurality of second sub-line segments sequentially connected together in the third direction; each first sub-line segment has a midpoint superposing with a midpoint of one of the second sub-line segments, the first sub-line segment and the second sub-line segment having superposed midpoints form a crossed structure, and define two opposite first angles and two opposite second angles; and each first angle is not greater than each second angle;

the crossed structure comprises a first virtual quadrangle and a second virtual quadrangle; the first sub-line segment is arranged in the first virtual quadrangle, and the first virtual quadrangle has a width being a maximum width of the first sub-line segment and a length being a length of the first sub-line segment; the second sub-line segment is arranged in the second virtual quadrangle, and the second virtual quadrangle has a width being a maximum width of the second sub-line segment and a length being a maximum length of the second sub-line segment; and for any crossed structure, two sides defining each first angle are a first side and a second side, respectively, and a length of a connection line between a point S1 on the first side and a point S2 on the second side is a maximum distance L1 between the first side and the second side; the connection line between the point S1 and the point S2 intersects with a side of the first virtual quadrangle at a point S3, intersects with a side of the second virtual quadrangle at a point S4, and a connection line between the point S3 and the point S4 has a length L2; wherein L1 is greater than L2.

2. The metal mesh according to claim 1, wherein the first sub-line segment in the crossed structure comprises two first branches, and a first connection part arranged between and connecting the two first branches together; the second sub-line segment comprises two second branches, and a second connection part arranged between and connecting the two second branches together; the first connection part and the second connection part are arranged in a crossed manner; the first branches and the second branches each have a maximum width $a1$, the first side and the second side each have a length $b1$, and the first connection part and the second connection part each have a width $c1$; where $3a1<b1<5a1$; and $0.6a1<c1<0.8a1$.

3. The metal mesh according to claim 2, wherein each first branch is connected to the first connection part to form a dihedral angle not less than 90°.

4. The metal mesh according to claim 2, wherein the first sub-line segment forms an axisymmetric pattern with a straight line running through a midpoint of the maximum width of the first sub-line segment in the second direction as an axis of symmetry; and the second sub-line segment forms an axisymmetric pattern with a straight line running through a midpoint of the maximum width of the second sub-line segment in the third direction as an axis of symmetry.

5. The metal mesh according to claim 1, wherein the first sub-line segment forms an axisymmetric pattern with a straight line running through a midpoint of the maximum width of the first sub-line segment in the second direction as an axis of symmetry; and the second sub-line segment forms an axisymmetric pattern with a straight line running through a midpoint of the maximum width of the second sub-line segment in the third direction as an axis of symmetry.

6. The metal mesh according to claim 1, wherein each first angle comprises a flat chamfer or a rounded chamfer; and in the crossed structure, a distance L3 is provided between an intersection point of extension lines of the first side and the second side and a vertex of the first angle, and a distance L4 is provided between the intersection point of the extension lines of the first side and the second side and a center of an intersection region of the first sub-line segment and the second sub-line segment; where L3:L4=1:10 to 1:2.

7. The metal mesh according to claim 1, wherein for any crossed structure, two sides defining each second angle are a third side and a fourth side, respectively, and a length of a connection line between a point S5 on the third side and a point S6 on the fourth side is a maximum distance L5 between the third side and the fourth side; the connection line between the point S5 and the point S6 intersects with a side of the first virtual quadrangle at a point S7, intersects with a side of the second virtual quadrangle at a point S8, and a connection line between the point S7 and the point S8 has a length L6; where L5 is greater than L6.

8. The metal mesh according to claim 7, wherein the connection line between the point S1 and the point S2 defines an area A with the first sub-line segment and the second sub-line segment, and the connection line between the point S5 and the point S6 defines an area B with the first sub-line segment and the second sub-line segment; and the first sub-line segment and the second sub-line segment have an intersection area C; where (A+B):C≤1:2.

9. The metal mesh according to claim 1, wherein each second angle comprises a rounded chamfer or a flat chamfer.

10. The metal mesh according to claim 1, wherein a connection line between vertices of the two second angles forms an angle with the first direction.

11. The metal mesh according to claim 1, wherein the first sub-line segment in the crossed structure comprises two first branches, and the second sub-line segment comprises two second branches; the crossed structure further comprises a first annular connection part connecting between the two first branches and the two second branches; and in the crossed structure, the two first branches and the two second branches are connected to the first annular connection part at different nodes from each other.

12. The metal mesh according to claim 11, wherein a first bridge part is connected between any adjacent two second angles with opposite openings.

13. A thin film sensor, comprising the metal mesh according to claim 1.

14. A mask, comprising: a light-shielding part and a light-transmitting part; wherein the light-shielding part comprises a plurality of first light-shielding strips and a plurality of second light-shielding strips arranged in a crossed manner; the plurality of first light-shielding strips extend in a second direction and arranged side by side in a first direction; and the plurality of second light-shielding strips extend in a third direction and arranged side by side in the first direction;
a maximum width of each first light-shielding strip is a first width, and a maximum width of each second light-shielding strip is a second width;
each first light-shielding strip comprises a plurality of first sub-shielding strips arranged in the second direction, each of which extends in the second direction and has a width equal to the first width; each second light-shielding strip comprises a plurality of second sub-shielding strips arranged in the third direction, each of which extends in the third direction and has a width equal to the second width;
wherein a distance is provided between any adjacent two of the first sub-shielding strips on any one of the first light-shielding strips; and any adjacent two of the first sub-shielding strips form a first sub-shielding part having a first end and a second end disposed oppositely; a distance is provided between any adjacent two of the second sub-shielding strips on any one of the second light-shielding strips; and any adjacent two of the second sub-shielding strips form a second sub-shielding part having a third end and a fourth end disposed oppositely; and
wherein the light-shielding part further comprises at least one first light-shielding unit each comprising the first sub-shielding part and the second sub-shielding part arranged in a crossed manner; the first end and the second end are centrosymmetric relative to a first symmetry point; and in the first light-shielding unit, two second sub-shielding strips comprise the third end and the fourth end disposed oppositely, and the third end and the fourth end are centrosymmetric relative to a second symmetry point.

15. The mask according to claim 14, wherein the first symmetry point and the second symmetry point in each first light-shielding unit coincide with each other.

16. The mask according to claim 14, further comprising a third connection part connected between adjacent two first sub-shielding strips in the second direction, and a fourth connection part connected between adjacent two second sub-shielding strips in the third direction; the third connection part and the fourth connection part in each first light-shielding unit are arranged in a crossed manner;
each first sub-shielding strip has a width a2, and the third connection part has a length b2 and a width c2; where 1.5a2<b2<2.5a2; and 0.6a2<c2<0.8a2; and
each second sub-shielding strip has a width d2, and the fourth connection part has a length e2 and a width f2; where 1.5d2<e2<2.5d2; and 0.6d2<f2<0.8d2.

17. The mask according to claim 16, wherein the width a2 of each first sub-shielding strip is equal to the width d2 of each second sub-shielding strip; the length b2 of the third connection part is equal to the length e2 of the fourth connection part; and the width c2 of the third connection part is equal to the width f2 of the fourth connection part.

18. The mask according to claim 16, wherein each first sub-shielding strip is connected to the third connection part to form a dihedral angle not less than 90°; and each second sub-shielding strip is connected to the fourth connection part to form a dihedral angle not less than 90°.

19. The mask according to claim 14, wherein each first light-shielding unit is further provided with a second annular connection part; and the second annular connection part is connected between two first sub-shielding strips and two second sub-shielding strips in the first light-shielding unit, and the two first sub-shielding strips and the two second sub-shielding strips are connected to the second annular connection part at different intersection points from each other.

20. The mask according to claim 19, wherein in each first light-shielding unit, the second annular connection part connects the two first sub-shielding strips and the two second sub-shielding strips in the first light-shielding unit together, and defines two opposite third angles and two opposite fourth angles, each third angle is not greater than each fourth angle, and a second bridge part is connected between two opposite fourth angles.

* * * * *